United States Patent
Wang et al.

(10) Patent No.: US 7,291,930 B2
(45) Date of Patent: Nov. 6, 2007

(54) INPUT AND OUTPUT CIRCUIT OF AN INTEGRATED CIRCUIT CHIP

(75) Inventors: Hsin-Shih Wang, Fremont, CA (US); Shang-Jyh Shieh, Kao-Hsiung Hsien (TW); Tzu-Pin Shen, Hsin-Chu (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 108 days.

(21) Appl. No.: 10/906,496

(22) Filed: Feb. 23, 2005

(65) Prior Publication Data

US 2006/0187601 A1  Aug. 24, 2006

(51) Int. Cl.
  *H01L 23/48* (2006.01)
  *H01L 23/52* (2006.01)
  *H01L 27/10* (2006.01)
(52) U.S. Cl. .............. 257/786; 257/773; 257/203; 257/691; 257/660; 257/E23.02
(58) Field of Classification Search ............ 257/659, 257/660, 203, 355, 786, 773, 173, E23.02
See application file for complete search history.

(56) References Cited

U.S. PATENT DOCUMENTS

| 5,535,084 | A | * | 7/1996 | Nakayama | 361/56 |
| 5,548,135 | A | * | 8/1996 | Avery | 257/173 |
| 5,671,026 | A | * | 9/1997 | Shiraki et al. | 349/40 |
| 5,731,945 | A | * | 3/1998 | Bertin et al. | 361/111 |
| 2001/0015447 | A1 | * | 8/2001 | Shinomiya | 257/203 |
| 2004/0026741 | A1 | * | 2/2004 | Saito et al. | 257/355 |
| 2004/0207079 | A1 | * | 10/2004 | Matsumoto | 257/724 |

\* cited by examiner

*Primary Examiner*—Nitin Parekh
(74) *Attorney, Agent, or Firm*—Winston Hsu

(57) ABSTRACT

An input and output circuit of an integrated circuit chip for exchanging signals between logic circuits of the integrated circuit chip and a system. The input and output circuit includes a plurality of power rings for providing a plurality of power sources, a plurality of input and output pads for transmitting signals, a sequence of input and output cells for transmitting signals, and a plurality of electrostatic discharge protection cells deposited within the sequence of input and output cells for performing electrostatic discharge protection for the input and output cells, wherein the plurality of electrostatic discharge protection cells are not coupled to any input and output pads.

5 Claims, 4 Drawing Sheets

INPUT AND OUTPUT CIRCUIT OF AN INTEGRATED CIRCUIT CHIP

BACKGROUND OF THE INVENTION

1. Field of the Invention

The present invention provides an input and output circuit of an integrated circuit chip, and more particularly, an input and output circuit with electrostatic discharge protection cells and probe pads corresponding to power rings deposited at appropriate positions of the chip, so as to increase available spaces for other probe pads, increase flexibility of power supply, and provide ESD protection.

2. Description of the Prior Art

Integrated circuits have been highly developed. Personal computers, mobile phones, digital watches, and calculators, for example, are applications of integrated circuits. With the development of semiconductor technologies, a system with multiple functions is integrated into a chip, which is called an application specific integrated circuit (ASIC), including a microprocessor, digital and analog signal processors, memories, etc. Therefore, the chip must include a plurality of input and output circuits for processing large amounts of data.

Please refer to FIG. 1, which illustrates a schematic diagram of a prior art integrated circuit chip 10. For succinctness, FIG. 1 illustrates only a corner of the chip 10. The chip 10 includes a substrate 12, a logic area 14, two input and output circuits 16, a plurality of corner wires 18, and a plurality of probe pads 20. Upon the input and output circuits 16, a plurality of power rings 22 are deposited for providing power sources. The chip 10 receives signals from a system through the probe pads 20, and transmits signals to a plurality of logic circuits (not shown in FIG. 1) in the logic area 14 through the input and output circuits 16. After performing a sequence of operations, the logic circuits in the logic area 14 transmit results to the system through the input and output circuits 16 and the probe pads 20.

For a layout of the input and output circuits 16, please refer to FIG. 2, which illustrates a schematic diagram of an input and output circuit 30 in a prior art chip. The input and output circuit 30 includes a plurality of input and output cells 32, a plurality of ESD protection and power source cell 34, a plurality of probe pads 36, and power rings 380, 382, 384, 386, 388, 390. Each input and output cell 32 receives signals from a system through the corresponding probe pad 36, and transmits signals to logic circuits of the chip for performing related operations. Conversely, the logic circuits outputs operation results to the system through the input and output cells 32 and the probe pads 36. Owing to continuous improvement in semiconductor technology, the physical area of an integrated circuit chip becomes smaller and smaller, but with more and more functions, and thus becomes more sensitive to damage from electrostatic discharge. As a result, electrostatic discharge, or ESD, protection becomes much more important, so that the input and output circuit 30 must conform to a specific rule. In FIG. 2, three ESD protection and power source cells 34 are placed between every three input and output cells 32. The ESD protection and power source cells 34 provide not only ESD protection, but also transmit power to the power rings 380, 382, 384, 386, 388, and 390 for providing power to the logic circuits inside the chip. The power rings 380, 382, 384, 386, 388, and 390 can have different voltages, and the ESD protection and power source cells 34 correspond to the voltages of the power rings 380, 382, 384, 386, 388, and 390 by turns. For example, in FIG. 2, the ESD protection and power source cells 341, 342, and 343 correspond to the power rings 380, 382, and 384, while the ESD protection and power source cells 344, 345, and 346 correspond to the power rings 386, 388, and 390. Therefore, the system can receive power from the probe pads 36 corresponding to the ESD protection and power source cells 34.

As FIG. 2 shows, in order to provide ESD protection, the ESD protection and power source cells 34 are added into the input and output circuit 30 for providing ESD protection and power supply. However, the probe pads 36 corresponding to the ESD protection and power source cells 34 (or to the input and output cells 32) which are not necessary to be used, must be bonded. For example, the ESD protection and power source cell 344 provides ESD protection, but is not necessary to provide power supply, so the probe pad 36 corresponding to the ESD protection and power source cell 344 is bonded. In short, since the input and output circuit 30 must conform to the rule for providing ESD protection, three ESD protection and power source cells 34 must be deposited for every three input and output cells 32. In this condition, available probe pads are limited, arrangement of the probe pads cannot be changed with respect to a user's requirement, and a signal to power ratio cannot be increased.

To solve the above-mentioned problem, please refer to FIG. 3, which illustrates a schematic diagram of an input and output circuit 40 of a chip. The input and output circuit 40 includes a plurality of integrated input and output cells 42, a plurality of probe pads 46, and power rings 480, 482, 484, 486, 488, and 490. Each integrated input and output cell 42 includes an input and output cell 32 and six ESD protection and power source cells 34 as shown in FIG. 2, so the integrated input and output cells 42 receive signals from a system through the corresponding probe pads 46, and transmit signals to logic circuits of the chip for performing operations. Oppositely, the logic circuits transmit results to the system through the integrated input and output cell 42 and the probe pad 46. Other than that, each integrated input and output cell 42 can provide ESD protection, and receive power from the power rings 480, 482, 484, 486, 488, and 490 for providing power to the logic circuits inside the chip or to the system outside the chip. In short, the integrated input and output cell 42 is a cell integrating the input and output cell 32 and the ESD protection and power source cells 34 shown in FIG. 2. Although the integrated input and output cells 42 can provide the functions of signal input and output, ESD protection, and power supply, each integrated input and output cell 42 occupies a large area, which is very precious in a integrated circuit. Moreover, comparing to the input and output circuit 30 in FIG. 2, there are far fewer available probe pads for the input and output circuit 40 in FIG. 3, limiting the applications.

SUMMARY OF INVENTION

It is therefore a primary objective of the claimed invention to provide an input and output circuit of an integrated circuit chip.

According to the claimed invention, the present invention discloses an input and output circuit of an integrated circuit chip for exchanging signals between logic circuits of the integrated circuit chip and a system. The input and output circuit includes a plurality of power rings for providing a plurality of power sources, a plurality of input and output pads for transmitting signals, a sequence of input and output cells for transmitting signals, and a plurality of electrostatic discharge protection cells deposited within the sequence of input and output cells for providing electrostatic discharge protection for the input and output cells, wherein the plurality of the electrostatic discharge protection cells are not coupled to any input and output pads.

According to the claimed invention, the present invention further discloses an input and output circuit of an integrated circuit chip for exchanging signals between logic circuits of the integrated circuit chip and a system. The input and output circuit includes a plurality of power rings for providing a plurality of power sources, a plurality of input and output pads for transmitting signals, a sequence of input and output cells for transmitting signals, a plurality of electrostatic discharge protection cells deposited within the sequence of the input and output cells for providing electrostatic discharge protection for the input and output cells, and a plurality of power pads coupled to the plurality of power rings for providing power sources.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
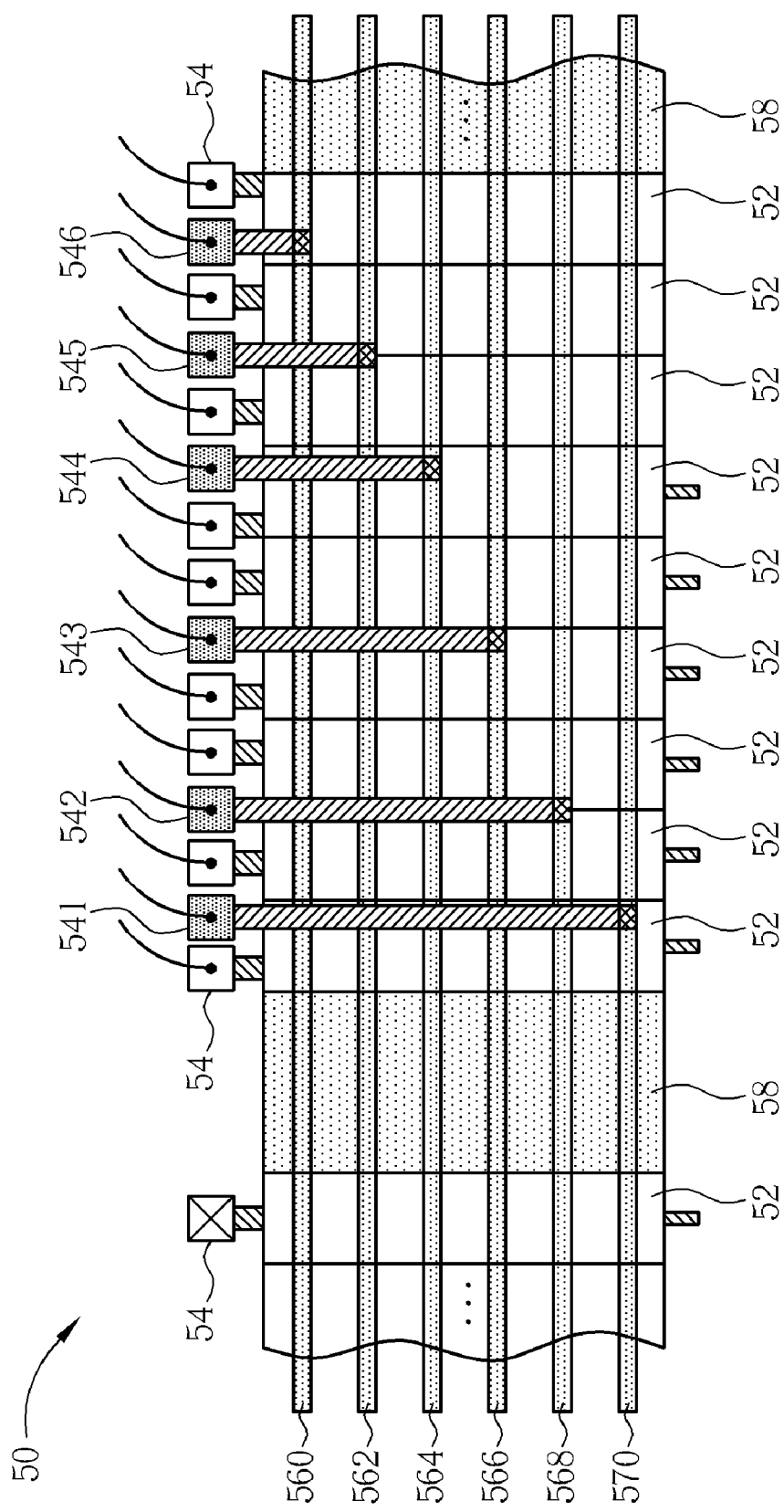
FIG. 4 illustrates a schematic diagram of an input and output circuit of an integrated circuit chip in accordance with the present invention.

Please refer to FIG. 4, which illustrates a schematic diagram of an input and output circuit 50 of an integrated circuit chip in accordance with the present invention. The input and output circuit 50 includes a plurality of input and output cells 52, a plurality of probe pads 54, power rings 560, 562, 564, 566, 568, 570, and a plurality of ESD protection cells 58. Each of the input and output cells 52 receives signals from a system through the corresponding probe pad 54, and transmits signals to logic circuits of the chip for performing operations. Conversely, the logic circuits transmit operation results to the system through the input and output cells 52 and the probe pads 54. According to a rule of ESD protection, the ESD protection cells 58 are deposited at specific positions within the input and output cells 52. Notice that the ESD protection cells 58 are not coupled to any probe pad, but only provide ESD protection. The power rings 560, 562, 564, 566, 568, and 570 can have different voltages. Therefore, the present invention can form a probe pad coupled to a power ring with a required voltage at any arbitrary position, which is close to a device needing a power supply in the system. For example, in FIG. 4, the probe pads 541, 542, 543, 544, 545, and 546 are coupled to the power rings 560, 562, 564, 566, 568, and 570 respectively. Therefore, the present invention forms a probe pad coupled to a power ring only when the system needs a power supply.

Electrostatic discharge, or ESD, is the main reason that breaks an electric element or device through by excessive electrical overstress, or EOS, causes permanent damage to the element or the device, and reduces functionality of an electric product using the electric element or device. When manufacturing, fabricating, testing, storing, or moving an electric element, an electrostatic charge is accumulated in human bodies, instruments, containers, or in the electric element itself, and in some conditions, those objects may contact each other, forming a discharge path, and causing the electric element damage. The present invention ESD protection cells 58 prevent damage due to electrostatic discharge to increase a signal to power ratio, a yield, and reliability of the chip.

Figure 1:
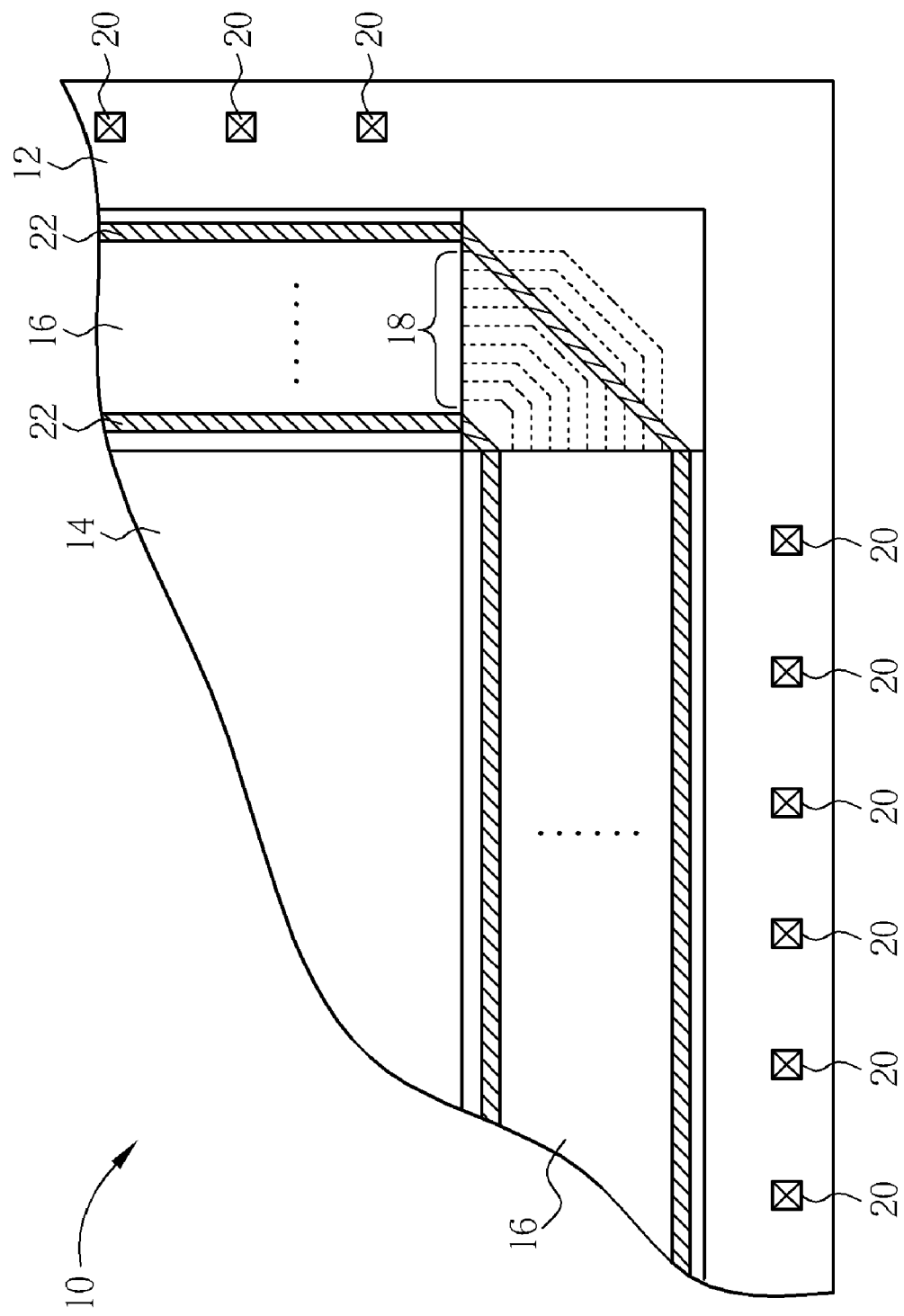
FIG. 1 illustrates a schematic diagram of a prior art integrated circuit chip.
Figure 2:
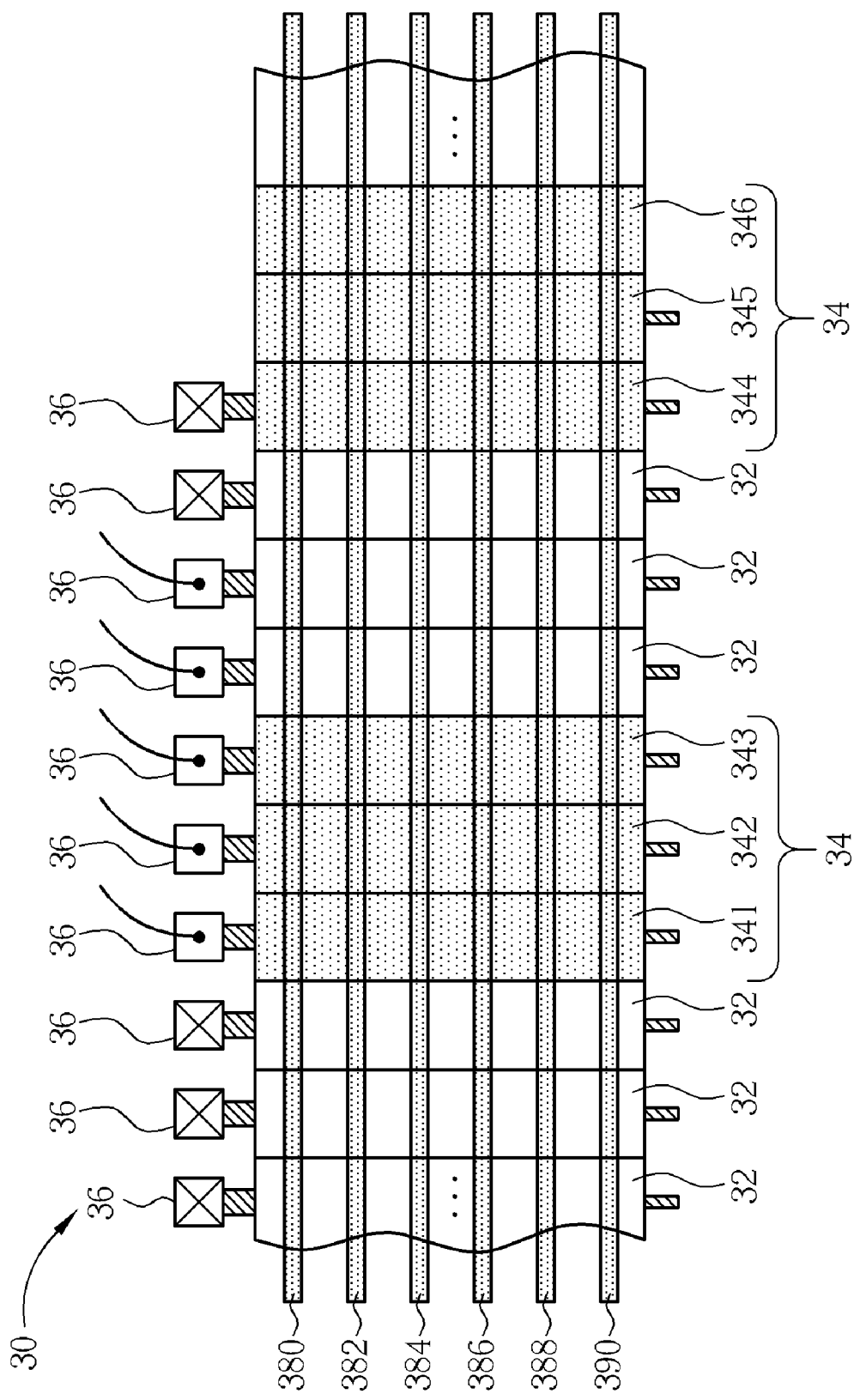
FIG. 2 illustrates a schematic diagram of a prior art input and output circuit of an integrated circuit chip.
Figure 3:
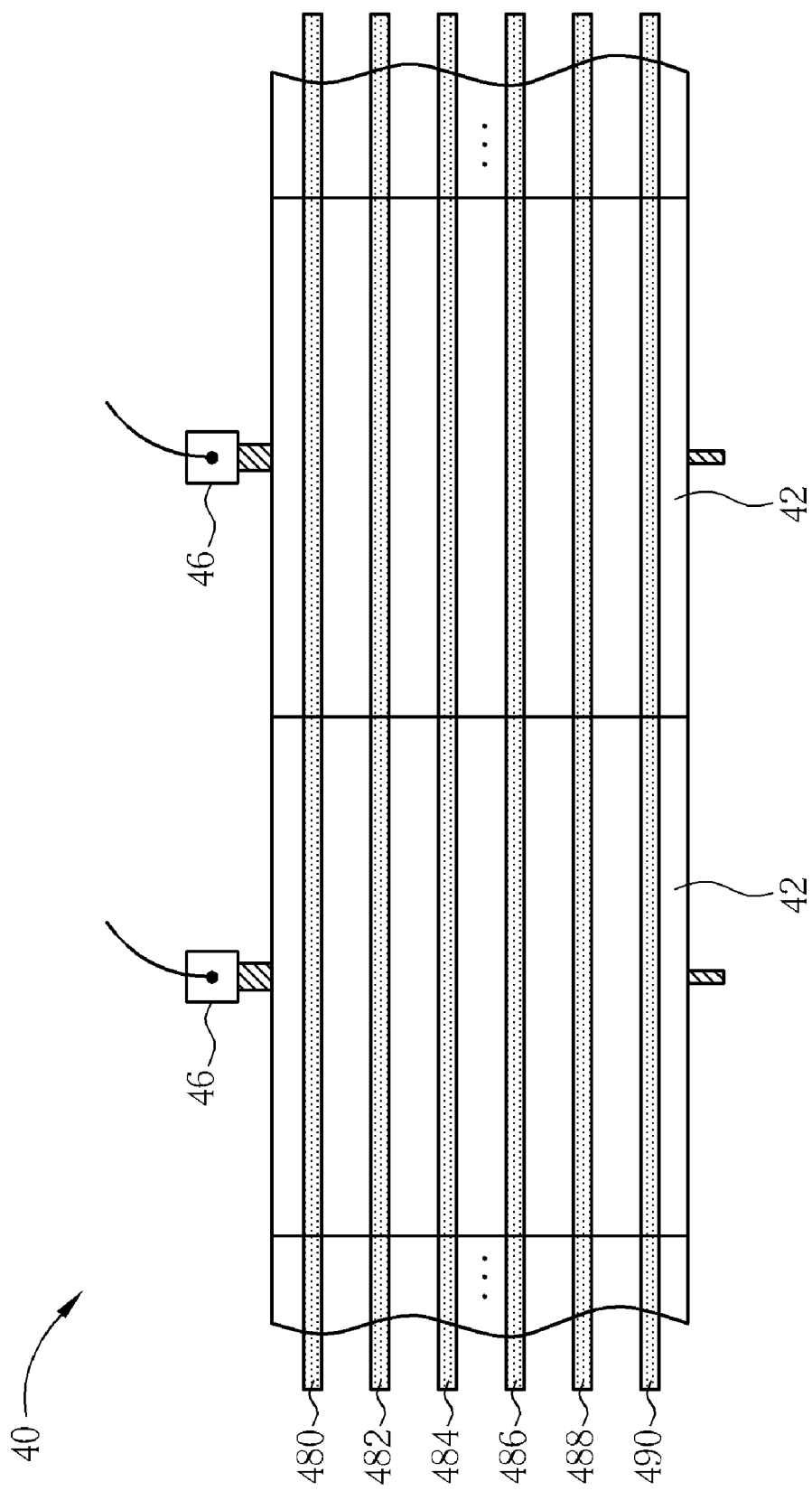
FIG. 3 illustrates a schematic diagram of a prior art input and output circuit of an integrated circuit chip.

In comparison, although the ESD protection and power source cells 34 of the input and output circuit 30 in FIG. 2 can provide ESD protection, when an ESD protection and power source cell 34 is not needed to provide power, the corresponding probe pad 36 must be bonded, which occupies available space of the probe pads 36 and wastes system resources. Especially for those chips made by high precision manufacturing techniques, such as a 90-nano-meter or other tiny processes, distances between transistors of the chip are limited, and the prior art ESD protection and power source cell 34 constrains the number and location of available probe pads. On the other hand, in the present invention, the ESD protection cell 58 is set only in a position where ESD protection is needed, such as in FIG. 4, where the ESD protection cells 58 are set every eight input and output cells 52. As a result, there are no probe pads corresponding to the ESD protection cells 58, thereby increasing the signal to power ratio, yield, and reliability of the chip, and decreasing the cost of production.

Furthermore, the present invention deposits the probe pads 54 corresponding to the power rings only when needing the power sources in the input and output circuit 50, which increases the available area of the probe pads 54, and, most important, flexibility of power supply. In contrast, the prior art input and output circuit 30 wastes space and has no flexibility of power supply, while the input and output circuit 40 has flexibility of power supply but occupies a lot of area.

In summary, the present invention provides an input and output circuit of an integrated circuit chip, which can increase the available areas of the probe pads, increase the flexibility of power supply, and provide ESD protection, so as to increase the signal to power ratio, the yield, and the reliability of the chip, and to decrease the cost of production.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An input and output circuit of an integrated circuit chip comprising:

a plurality of power rings for providing a plurality of power sources;

a sequence of input and output adjacent cells extending in one direction, each of the input and output cells having a corresponding probe pad; and at least an additional probe pad disposed between the probe pads of the input and output each additional probe pad directly connecting to a corresponding power ring wherein each additional probe pad is connected to respective one of the power rings through a conductive layout which has a projective outline in a plan view partially overlapping corresponding input and output cell and extending laterally to the one direction.

2. The input and output circuit of claim 1, wherein each of the additional probe pad transmits power to the corresponding power ring.

3. The input and output circuit of claim 1, wherein each of the additional probe pad is electrically isolated from the input and output cells.

4. The input and output circuit of claim 1, wherein each of the additional probe pad is connected to one of the power rings through a conductive layout which is electrically isolated from the input and output cells.

5. The input and output circuit of claim 1, wherein each of the power rings has a projective outline in a plan view partially overlapping the input and output cells and extending in the one direction.

* * * * *